US006837063B1

(12) United States Patent
Hood, III et al.

(10) Patent No.: US 6,837,063 B1
(45) Date of Patent: Jan. 4, 2005

(54) POWER MANAGEMENT OF A COMPUTER WITH VAPOR-COOLED PROCESSOR

(75) Inventors: Charles D. Hood, III, Cedar Park, TX (US); Curtis L. Progl, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/631,157

(22) Filed: Jul. 31, 2003

(51) Int. Cl.[7] .................. F25D 23/12; F25D 27/00; F28D 15/00; H05K 7/20
(52) U.S. Cl. ............... 62/259.2; 62/238.1; 165/104.25; 165/104.21; 361/688
(58) Field of Search ........................ 62/259.2, 238.1, 62/238.3, 228.1; 165/104.21, 104.25, 104.31, 104.32, 104.33; 361/676, 688, 697, 702

(56) References Cited

U.S. PATENT DOCUMENTS

| | | | |
|---|---|---|---|
| 4,674,004 A | 6/1987 | Smith et al. .................. 361/384 |
| 5,351,498 A | 10/1994 | Takahashi et al. ............. 62/99 |
| 5,785,116 A | 7/1998 | Wagner ..................... 164/80.3 |
| 5,796,580 A | 8/1998 | Komatsu et al. ............ 361/687 |
| 5,818,694 A | 10/1998 | Daikoku et al. ............ 361/703 |
| 6,043,980 A | 3/2000 | Katsui ........................ 361/695 |
| 6,148,635 A | 11/2000 | Beebe et al. .................. 62/498 |
| 6,152,214 A | 11/2000 | Wagner ....................... 165/121 |
| 6,167,621 B1 | 1/2001 | Goth et al. ............. 29/890.054 |
| 6,172,872 B1 | 1/2001 | Katsui ........................ 361/695 |
| 6,182,742 B1 | 2/2001 | Takahashi et al. ...... 165/104.33 |
| 6,198,628 B1 | 3/2001 | Smith ......................... 361/695 |
| 6,301,111 B1 | 10/2001 | Katsui ........................ 361/697 |
| 6,351,384 B1 | 2/2002 | Daikoku et al. ............ 361/704 |
| 6,393,853 B1 | 5/2002 | Vukovic et al. ........... 62/259.2 |
| 6,415,619 B1 | 7/2002 | Bash et al. ................ 62/228.4 |
| 6,490,875 B2 | 12/2002 | Chua et al. .................. 62/144 |
| 6,490,877 B2 | 12/2002 | Bash et al. .................. 62/200 |
| 6,501,652 B2 | 12/2002 | Katsui ........................ 361/697 |

OTHER PUBLICATIONS

Lee Bruno, "Cooooool!," *Red Herring*, pp. 34–37.

*Primary Examiner*—Chen Wen Jiang
(74) *Attorney, Agent, or Firm*—Baker Botts L.L.P.

(57) ABSTRACT

A system and method for power management of a computer with a vapor-cooled processor is disclosed. A dual mode cooling system for an information handling system includes a heat exchanger for receiving heat generated by the information handling system. The system further includes a condenser in communication with the heat exchanger such that the heat received at the heat exchanger is transferred to the condenser. The heat exchanger and the condenser are able to selectively operate in an active cooling mode and a passive cooling mode.

20 Claims, 2 Drawing Sheets

POWER MANAGEMENT OF A COMPUTER WITH VAPOR-COOLED PROCESSOR

TECHNICAL FIELD

This disclosure relates in general to the field of computers, and more particularly to a system and method for power management of a computer with a vapor-cooled processor.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems include processors, which produce heat. In information handling systems such as desktop computers, the heat produced by the processors is typically managed with the air cooling. However, as air cooling has inherent limitations that may be exceeded by microprocessors that are increasingly dense and powerful.

The cooling requirements of some information handling systems, such as over clocker-type systems, require active cooling. One type of active cooling system used for these systems to provide the necessary cooling capacity are compression refrigeration systems, require active cooling. One type of active cooling system used for these systems to provide the necessary cooling capacity are compression refrigeration systems. This enhanced cooling capacity allows systems with over-clocked microprocessors to operate at CPU frequencies above the rated specification.

In systems that utilize active refrigeration systems, the refrigeration systems are typically activated prior to activating the system. Additionally, those systems typically interlock the computer system to the refrigeration system to prevent operation of the computer system without operating the refrigeration system. Active refrigeration systems require significant power resources, increasing operational costs. These operational costs are particularly high for systems that are operated continuously. Operation of an active refrigeration system typically creates a significant amount of noise, which may negatively effect the operation and efficiency of the microprocessor or other components of the system.

SUMMARY

Thus, a need has arisen for a system and method for efficiently implementing a vapor-cooled system for heat dissipation in an information handling system.

A further need has arisen for a system and method for reducing the noise and power consumption associated with cooling and operating an information handling system.

In accordance with the teachings of the present disclosure, the disadvantages and problems associated with power management of a vapor-cooled processor have been substantially reduced or eliminated. In some embodiments of the present disclosure, a dual mode cooling system for an information handling system includes a heat exchanger for receiving heat generated by the information handling system. The system further includes a condenser in communication with the heat exchanger such that the heat received at the heat exchanger is transferred to the condenser. The heat exchanger and the condenser are able to selectively operate in an active cooling mode and a passive cooling mode.

In another embodiment, an information handling system using power management controls for a dual mode cooling system includes a processor disposed within the information handling system, the processor operable to process information. The information handling system also includes a dual mode cooling system having a heat exchanger and a condenser that are able to selectively operate in an active cooling mode and a passive cooling mode. The heat exchanger is thermally coupled to the processor and the heat exchanger includes a refrigerant line extending therethrough. The heat exchanger transfers heat generated by the processor to a refrigerant flowing in the refrigerant line. The condenser is in communication with the heat exchanger such that the refrigerant is able to flow to the condenser wherein the heat transferred to the refrigerant is expelled at the condenser. The information handling system further includes a power management control coupled to the information handling system. The power management control selectively activates the passive cooling mode and the active cooling mode of the dual mode cooling system.

In a further embodiment, a method for cooling an information handling system using a dual mode cooling system includes receiving heat generated by at least on component in an information handling system at a heat exchanger. The method transfers the heat to a condenser such that the condenser expels the heat from the information handling system. The method also monitors an operating condition of the information handling system with a power management control. Based on the operating condition, the method automatically operates the heat exchanger and condenser in either a passive cooling mode or an active cooling mode.

The present disclosure contains a number of important technical advantages. One technical advantage is an efficient operation of an information handling system using a dual mode cooling system. Because the dual mode cooling system selectively operates in either an active cooling mode or a passive cooling mode, the cooling system can reduce the operational costs by utilizing the passive cooling mode, while conserving power resources. The dual mode cooling system typically uses a power management control to monitor a component in the information handling system, such as a processor, when selecting whether to operate in the active cooling mode or the passive cooling mode. Thus, the information handling system may operate more efficiently by using a dual mode cooling system.

A further technical advantage includes a system and method that provides efficient cooling for an information handling system while generating less noise. Previous cooling system used a vapor compression system that required the cooling system be operational whenever the information handling system was operating. By using a dual mode cooling system with a passive cooling mode, the information handling system can deactivate the active cooling mode and operate in the passive cooling mode. As such, the noise associated with operating a compressor in the active cooling mode can be reduced.

All, some, or none of these technical advantages may be present in various embodiments of the present invention. Other technical advantages will be apparent to one skilled in the art from the following figures, descriptions, and claims.

BRIEF DESCRIPTION OF THE DRAWINGS

A more complete understanding of the embodiments of the present disclosure and advantages thereof may be acquired by referring to the following description taken in conjunction with the accompanying drawings, in which like reference numbers indicate like features, and wherein.

DETAILED DESCRIPTION

Preferred embodiments of the present disclosure and their advantages are best understood by reference to FIGS. 1 through 6, where like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices, as well as various input and output (I/O) devices, such as a keyboard, a mouse, and a video display. The information handling system may also include one or more buses operable to transmit communications between the various hardware components.

Figure 1:
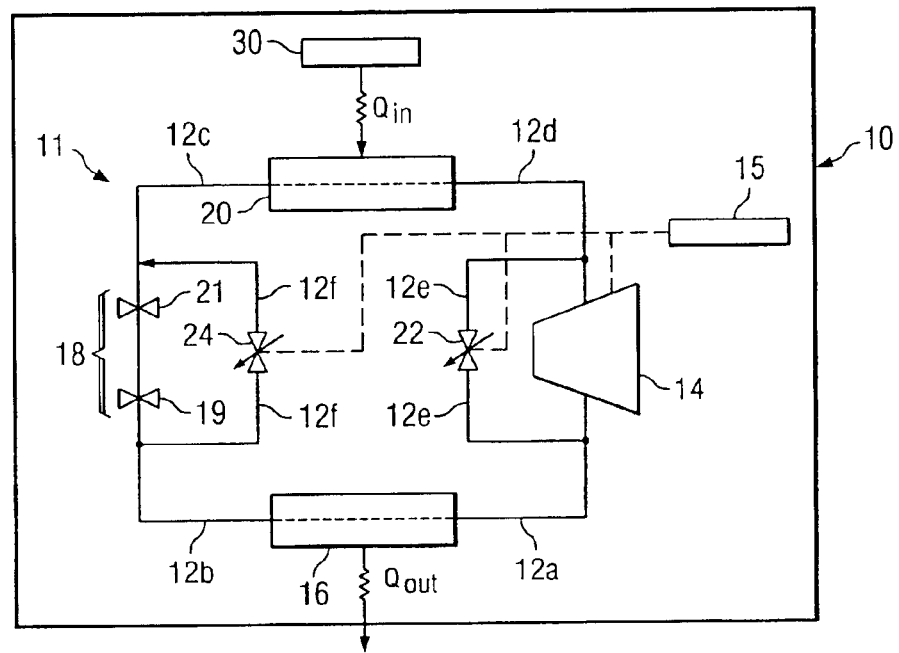
FIG. 1 is a schematic view of an information handling system using a dual mode cooling system including power management controls according to an example embodiment of the present disclosure.

FIG. 1 is a schematic view of information handling system 10 using dual mode cooling system 11 including power management controls 15. Dual mode cooling system 11 generally includes condenser 16 and heat exchanger 20 that are selectively operated in either an active cooling mode or a passive cooling mode. Typically, the mode of operation is controlled by power management control 15. Based on a mode of operation, dual mode cooling system 11 may be selectively operated in an active cooling mode or a passive cooling mode.

Power management control 15 is generally coupled to information handling system 10 but also may be a separate control system that is used to monitor one or more components within information handling system 10. Power management control 15 may include computer programs, processors, sensors or any other device operable to selectively activate the active cooling mode or the passive cooling mode of dual mode cooling system 11. In certain embodiments, power management control 15 monitors the activity of information handling system 10 to determine whether to operate the active cooling mode or the passive cooling mode of dual mode cooling system 11.

Condenser 16 generally receives heat generated by a component, such as processor 30, within information handling system 10 via a refrigerant flowing in refrigerant line 12a. Within condenser 16, the heat within the refrigerant is expelled outside of information handling system 10. After the refrigerant passes through condenser 16, the refrigerant enters refrigerant line 12b and returns to heat exchanger 20 via refrigerant line 12c.

Heat exchanger 20, which may also be known as an evaporator, transfers the heat generated by processor 30 to the refrigerant. The heat generated by processor 30 typically varies depending upon the processes being performed by information handling system 10. Thus, the greater the process power required by information handling system 10, processor 30 generates a greater amount of heat. As such, the amount of heat transferred to the refrigerant in heat exchanger 20 varies. Once the heat is transferred, the refrigerant leaves heat exchanger 20 via refrigerant line 12d to enter condenser 16 via refrigerant line 12a.

In some embodiments, dual mode cooling system may further include compressor 14. Generally, when operating in the active cooling mode, compressor 14 may be activated to interact with the refrigerant received via refrigerant line 12d that exits heat exchanger 20. As such, compressor 14 may receive a refrigerant in a vapor phase, liquid phase or vapor-liquid phase via refrigerant line 12d. Compressor 14 can be used to drive the refrigerant in a closed loop cooling system such that the heat generated by a component, such as processor 30, in information handling system 10 can be removed. During the compression of the refrigerant, the refrigerant is typically compressed to a higher pressure and temperature.

Generally, the amount of energy needed to cool a component in information handling system 10 is dependent on the amount of cooling required. Basically, the faster and more powerful microprocessor used in information handling system 10 usually requires the use of a high capacity cooling system that consumes large amounts of power. In some instances, these high capacity cooling systems may use large compressors that generate high levels of noise when compressing the refrigerant.

However, when operating in a passive cooling mode, dual mode cooling system 11 may include compressor bypass valve 22. Compressor bypass valve 22 may be activated or actuated from power management control 15. Concurrent to the activation of compressor bypass valve 22, power management control 15 may deactivate the operation of compressor 14. Compressor bypass valve 22 may include a switchable valve that is activated or switched using power management control 15 to allow the refrigerant to bypass compressor 14. For example, compressor bypass valve 22 actuated via a pneumatic, an electronic, a magnetic, a mechanical, a manual device or any other suitable device operable to actuate a valve.

When activated, compressor bypass valve 22 may receive the refrigerant coming from heat exchanger 20 via refrigerant line 12*d* by entering refrigerant line 12*e*. Generally, when the refrigerant is flowing through refrigerant line 12*e*, compressor 14 is deactivated such that the refrigerant is blocked from passing through compressor 14.

Dual mode cooling system 11 may also include expansion valve assembly 18. When operating in the active cooling mode, expansion valve assembly typically includes solenoid valve 19 and capillary tube 21. Solenoid valve 19 meters the flow of refrigerant through refrigerant line 12*b* to refrigerant line 12*c* to control the supply or flow of refrigerant to heat exchanger 20.

Capillary tube 21, generally downstream of solenoid valve 19, functions to release the pressure of the refrigerant flowing or passing through capillary tube 21 such as in a throttling process. Examples of capillary tube 21 include a partially open valve, a porous media, a line restriction or any device suitable to provide a desired drop or restriction within refrigerant line 12.

During the throttling process, the refrigerant generally undergoes a phase change by expanding the refrigerant that may be in a saturated liquid state to a lower pressure. In some instances, some or all of the refrigerant may transform from a liquid phase to a vapor phase that is associated with the drop in pressure. Further associated with the drop in pressure, the temperature of the refrigerant will also decrease in the throttling process. As such, the refrigerant leaving expansion valve assembly 18 may be in vapor or liquid-vapor phase as it enters heat exchanger 20 via refrigerant line 12*c*.

However, when operating in a passive cooling mode, dual mode cooling system 11 may further include expansion bypass valve 24. Expansion bypass valve 24 may be activated or actuated from power management control 15. Concurrent to the activation of expansion bypass valve 24, power management control 15 may deactivate the operation of expansion valve assembly 18.

When activated, expansion bypass valve 24 may receive the refrigerant coming from condenser 16 via refrigerant line 12*b* by entering refrigerant line 12*f*. Generally, when the refrigerant is flowing through refrigerant line 12*f*, expansion valve 18 is deactivated such that the refrigerant is blocked from passing through expansion valve assembly 18.

The refrigerant used in dual mode cooling system 11 includes inert materials that are used to transfer heat from the information handling system. Examples of refrigerants include ammonia, Freon such as R-12, R-22 and R-134a, carbon dioxide, methyl chloride, sulfur dioxide, water, air, methanol, fluorocarbons, n-triacontane water emulsions, nitrogen, fluorinert, any combination thereof or any suitable material or medium that is capable of transferring heat from a component in information handling system 10.

When operating in the passive cooling mode, dual mode cooling system 11 may function as a basic thermo-siphon system. As such, refrigerant lines 12 may include heat pipes or thermal tubes to move heat to the refrigerant or move the refrigerant through dual mode cooling system 11.

In another example embodiment, the passive cooling mode of dual mode cooling system 11 utilizes gravity to drive the refrigerant within refrigerant lines 12. When the refrigerant is in a liquid state, gravity causes the refrigerant to collect or gather at the lowest point of information handling system 10, generally at heat exchanger 20, such that the refrigerant comes into contact a heat source, such as processor 30. As the heat is transferred to the refrigerant, the refrigerant begins to move within heat exchanger 20 typically due to convection and in some instances the refrigerant vaporizes. As the heated refrigerant rises and moves within dual mode cooling system 11, the refrigerant may be cooled upon reaching condenser 16 or within refrigerant lines 12. At this point, the refrigerant may re-condense into a liquid phase and return via gravity to heat exchanger 20.

Figure 2:
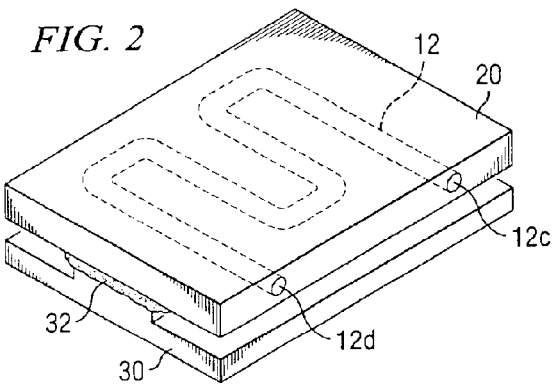
FIG. 2 illustrates a processor in the information handling system coupled to a heat exchanger according to an example embodiment of the present disclosure.

FIG. 2 illustrates processor 30 in information handling system 10 coupled to heat exchanger 20. An example of heat exchanger 20 may include an evaporator. Heat exchanger 20 includes a flow path for refrigerant line 12 such that the refrigerant may be received from refrigerant line 12*c* and after passing through heat exchanger 20 exits via refrigerant line 12*d*. While the refrigerant pass through heat exchanger 20, the heat from processor 30 is transferred to the refrigerant.

Typically, processor 30 is disposed adjacent to heat exchanger 20 and uses interface material 32 such as a thermal paste to facilitate the transfer of heat from processor 30 to the refrigerant pass through heat exchanger 20. As such, the transfer of heat to the refrigerant that is moving through heat exchanger 20 may be performed while dual mode cooling system 11 is operating in the active cooling mode or in the passive cooling mode.

Figure 3:
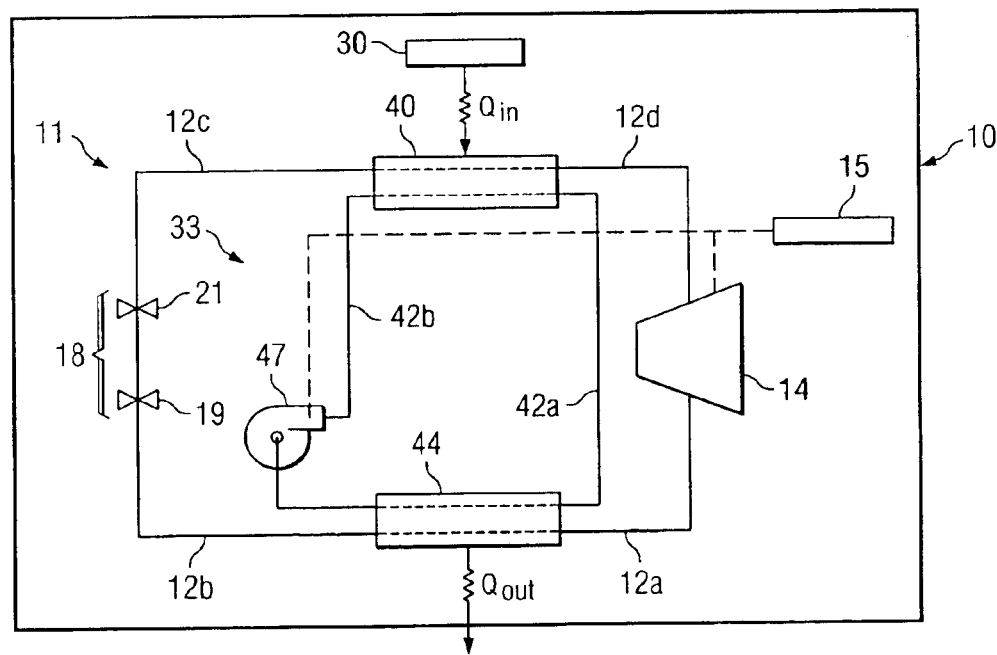
FIG. 3 is a schematic view of an information handling system using a dual mode cooling system including a liquid loop cooling line according to an example embodiment of the present disclosure.

FIG. 3 is a schematic view of another example embodiment of dual mode cooling system 11 including liquid loop cooling system 33 to enable a passive cooling mode. In some embodiments, dual mode cooling system 11 includes liquid loop cooling system 33 having a second refrigerant line that flows through dual path heat exchanger 40 and dual path condenser 44. Typically, liquid loop cooling system 33 includes liquid lines 42*a* and 42*b* that are fluidly isolated from refrigerant line 12 to operate in a passive cooling mode.

When operating in the passive cooling mode, dual path heat exchanger 40 may receive a second refrigerant such as a cooling liquid via liquid line 42*b*. Because dual mode cooling system 11 is operating in the passive cooling mode, power management control 15 generally deactivates compressor 14, which prevents the flow of refrigerant through refrigerant lines 12*a*, 12*b*, 12*c* and 12*d*. With the transfer of heat from processor 30 to the cooling liquid moving through dual path heat exchanger 40, the cooling liquid is communicated to dual path condenser 44 via liquid line 42*a*. As the cooling liquid passes through dual path condenser 44, the heat is removed from the cooling liquid and expelled from information handling system 10, wherein the cooling liquid is circulated back to dual path heat exchanger 40.

Generally, liquid loop cooling system 33 utilizes pump 47 to drive the cooling liquid through liquid lines 42*a* and 42*b*. As such, pump 47 may be placed along any portion of liquid line 42*a* and 42*b* such that the cooling liquid can be pumped through liquid loop cooling system 33. Because pump 47 is connected with the passive cooling mode of dual mode cooling system 11, the activation of pump 47 is typically controlled via power management control 15 and thus is deactivated when operating in the active cooling mode.

Figure 4:
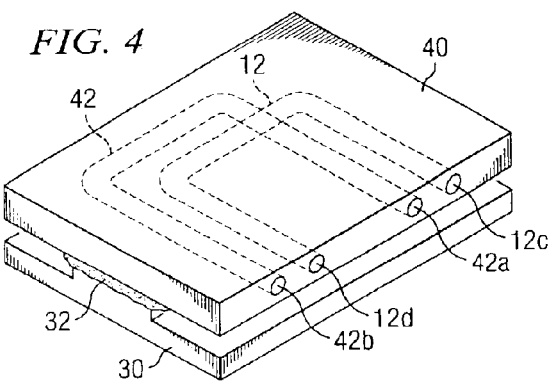
FIG. 4 illustrates the processor in the information handling system coupled to a dual path heat exchanger according to an example embodiment of the present disclosure.

As shown in FIG. 4, dual path heat exchanger 40 may provide two flow paths for operating in the different cooling modes, namely the passive cooling mode and the active cooling mode. Dual path heat exchanger 40 may be coupled to processor 30 via interface material 32 to facilitate the transfer of heat from processor 30 to the refrigerant or cooling liquid moving through dual path heat exchanger 40 via refrigerant line 12 and liquid line 42.

Figure 5:
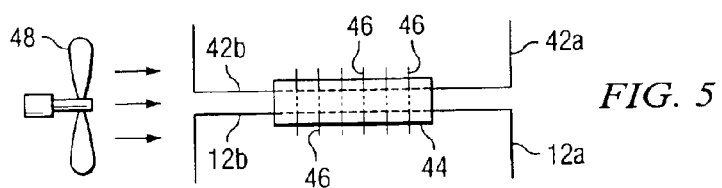
FIG. 5 illustrates a dual path condenser according to an example embodiment of the present disclosure.

FIG. 5 illustrates dual path condenser 44 including cooling fins 46. In order to provide efficient cooling or removal of heat from information handling system 10, dual path condenser 44 includes cooling fins 46 to facilitate in the transfer of heat from the refrigerant or cooling liquid flowing through dual path condenser 44. Although not shown, cooling fins 46 may also be formed on condenser 16.

Similar to dual path heat exchanger 40, dual path condenser 44 may operate in either a passive cooling mode or an active cooling mode as controlled or selected via power management control 15. In the active cooling mode, the refrigerant generally enters dual path condenser via refrigerant line 12*a* and exits via refrigerant line 12*b*. In the passive cooling mode, cooling liquid generally enters dual path condenser via liquid line 42*a* and exits via liquid line 42*b*.

Whether operating in the active or passive cooling mode, dual mode cooling system 11 may utilize cooling fan 48 to provide additional cooling to cooling fins 46 and dual mode condenser 44 by using forced convection to move air across cooling fins 46. Cooling fan 48 may be controlled or activated via power management controls 15 in response to operating in the passive cooling mode or active cooling mode.

Figure 6:
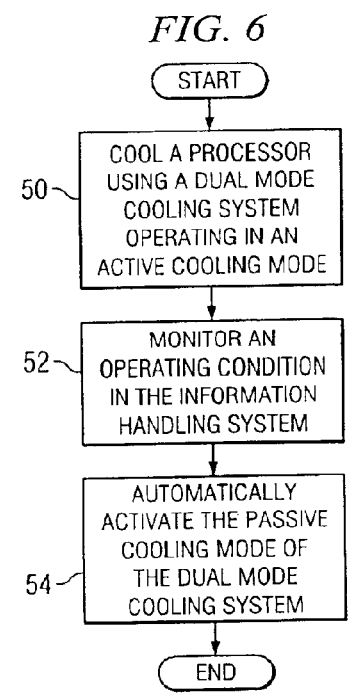
FIG. 6 illustrates a flowchart for using a power management control of a dual mode cooling system in an information handling system according to an example embodiment of the present disclosure.

FIG. 6 illustrates a flowchart for power management of dual mode refrigeration system 11 used with information handling system 10. At step 50, the method cools information handling system 10 by operating dual mode cooling system 11 in an active cooling mode such as using a refrigeration system. In one embodiment, dual mode cooling system 11 includes condenser 16 and heat exchanger 20 that may be selectively activated or controlled using power management control 15 in order to operate in either a passive cooling mode or an active cooling mode.

At step 52, the method monitors an operating condition of information handling system 10 using power management control 15. An example of an operating condition includes monitoring the temperature of one or more of the devices or components within information handling system 10. For instance, the temperature of processor 30 can be monitored such that dual mode cooling system operates in an active cooling mode when the temperature is above a certain temperature level. As such, when the temperature of processor 30 falls below the certain temperature level, dual mode cooling system 11 may be selectively activated to operate in the passive cooling mode via power management control 15, as shown at step 54. Typically, when power management control 15 activates the passive cooling mode of dual mode cooling system 11, the active cooling mode is deactivated or prevented from operating.

Another operating condition of information handling system 10 that may be monitored by power management control 15 includes operating information handling system 10 in a low power state. Typically, when information handling system 10 is operating but is not being used, information handling system 10 may activate a power management program such that the system begins to operate in a low power state. At such time, power management control 15 may recognize this operating condition and cause dual mode cooling system 11 to operation in a passive cooling mode.

A further example of an operating condition that may be monitored by power management control 15 includes a failure of the active cooling mode in dual mode cooling system 11. Because the active cooling mode of dual mode cooling system may include several cooling components that are more susceptible to failure, the active cooling mode may become inoperable. For example, compressor 14 may be a vital component in the active cooling mode (e.g., used to circulate the refrigerant) such that failure of compressor 14 may cause the active cooling mode to become ineffective. After determining a failure of the active cooling mode, power management control 15 can selectively activate the passive cooling mode and, in some instances, notify a user of the failure.

As previously discussed, the passive cooling mode may include the activation of compressor bypass valve 22 and/or the activation of expansion bypass valve 24. When operating in the active cooling mode, power management control 15 may be used to deactivate compressor bypass valve 22 and/or expansion bypass valve 24.

Although the present disclosure has been described with respect to a specific embodiment, various changes and modifications will be readily apparent to one skilled in the art. The present disclosure is not limited to the illustrated embodiment, but encompasses such changes and modifications that fall within the scope of the appended claims.

What is claimed is:

1. A dual mode cooling system for an information handling system comprising:
   a heat exchanger for receiving heat generated by the information handling system;
   a condenser in communication with the heat exchanger such that the heat received at the heat exchanger is transferred to the condenser; and
   the heat exchanger and the condenser able to selectively operate in an active cooling mode and a passive cooling mode.

2. The dual mode cooling system of claim 1, further comprising:
   a power management control coupled to the information handling system; and
   the power management control operable to monitor an operating condition of at least one component in the information handling system such that the power management control operate the heat exchanger and the condenser in either the active cooling mode or the passive cooling mode based on the operating condition of the at least one component.

3. The dual mode cooling system of claim 2, further comprising:
   a compressor in communication with the heat exchanger and the condenser via a refrigerant line;
   the compressor operable to drive a refrigerant between the heat exchanger and the condenser when operated in the active cooling mode;
   a compressor bypass valve coupled to the refrigerant line in parallel to the compressor; and
   the compressor bypass valve operable to permit the refrigerant to flow freely between the heat exchanger and the condenser without passing through the compressor when operated in the passive cooling mode.

4. The dual mode cooling system of claim 2, further comprising:
   an expansion valve assembly fluidly coupled to the refrigerant line downstream of the condenser and upstream of the heat exchanger;

an expansion bypass valve coupled to the refrigerant line in parallel with the expansion valve assembly; and the expansion bypass valve operable to permit the refrigerant to flow freely between the condenser to the heat exchanger without passing through the expansion valve assembly when operated in the passive cooling mode.

5. The dual mode cooling system of claim 2, further comprising:

a liquid cooling line in communication with the heat exchanger and the condenser; and a liquid refrigerant disposed in the liquid cooling line, the liquid refrigerant operable to move between the heat exchanger and the condenser when operated in a passive cooling mode.

6. The dual mode cooling system of claim 5, further comprising a pump coupled to the liquid cooling line, the pump activated via the management power control and operable to circulate the liquid refrigerant within the liquid cooling line.

7. The dual mode cooling system of claim 5, wherein the heat exchanger comprises a dual path heat exchanger including a refrigerant line and the liquid cooling line extending therethrough.

8. The dual mode cooling system of claim 5, wherein the condenser comprises a dual path condenser including a refrigerant line and the liquid cooling line extending therethrough.

9. An information handling system using power management controls for a dual mode cooling system, comprising:

a processor disposed within the information handling system, the processor operable to process information;

a dual mode cooling system including a heat exchanger and a condenser that are able to selectively operate in an active cooling mode and a passive cooling mode;

the heat exchanger thermally coupled to the processor, the heat exchanger including a refrigerant line extending therethrough;

the heat exchanger operable to transfer heat generated by the processor to a refrigerant flowing in the refrigerant line;

the condenser in communication with the heat exchanger such that the refrigerant is able to flow to the condenser wherein the heat transferred to the refrigerant is expelled at the condenser; and a power management control coupled to the information handling system, the power management control operable to selectively activate the passive cooling mode and the active cooling mode of the dual mode cooling system.

10. The information handling system of claim 9, further comprising:

a compressor coupled to the refrigerant line, the compressor operable to drive the refrigerant between the heat exchanger and the condenser when operated in the active cooling mode;

a compressor bypass valve coupled to the refrigerant line in parallel to the compressor; and the compressor bypass valve operable to permit the refrigerant to flow through the refrigerant line without passing through the compressor when operated in the passive cooling mode.

11. The information handling system of claim 9, further comprising:

an expansion valve assembly coupled to the refrigerant line, the expansion valve assembly operable to interact with the refrigerant when operated in the active mode;

an expansion bypass valve coupled to the refrigerant line in parallel with the expansion valve assembly; and the expansion bypass valve operable to permit the first refrigerant to flow through the first refrigerant line without passing through the expansion valve assembly when operated in the passive cooling mode.

12. The information handling system of claim 9, further comprising:

a liquid loop cooling line fluidly isolated from the refrigerant line, the liquid loop cooling line coupled to the heat exchanger and the condenser;

a liquid refrigerant disposed within the liquid loop cooling line; and a pump fluidly coupled to the liquid loop cooling line, the pump operable to drive the liquid refrigerant between heat exchanger and condenser when operated in a passive cooling mode.

13. A method for cooling an information handling system using a dual mode cooling system, comprising:

receiving heat generated by at least on component in an information handling system at a heat exchanger;

transferring the heat to a condenser such that the condenser expels the heat from the information handling system;

monitoring an operating condition of the information handling system with a power management control; and based on the operating condition, automatically operating the heat exchanger and condenser in either a passive cooling mode or an active cooling mode.

14. The method of claim 13, wherein the operating condition of the information handling system comprises a temperature of the at least one component in the information handling system.

15. The method of claim 13, wherein the operating condition of the information handling system comprises a low power state of the information handling system such that the information handling system operates in a reduced power condition.

16. The method of claim 13, wherein the operating condition of the information handling system comprises a failure of operating the heat exchanger and condenser in the active cooling mode.

17. The method of claim 13, wherein operating the heat exchanger and the condenser in the passive cooling mode further comprising activating a compressor bypass valve such that a refrigerant circulates between the heat exchanger and the condenser without passing through a compressor.

18. The method of claim 13, wherein operating the heat exchanger and the condenser in the passive cooling mode further comprising activating an expansion bypass valve such that the refrigerant circulates between the heat exchanger and the condenser without passing through an expansion valve assembly.

19. The method of claim 18, wherein operating the heat exchanger and the condenser in the passive cooling mode further comprising circulating a liquid refrigerant in a liquid loop cooling line such that the liquid loop cooling line and the refrigerant line are fluidly isolated.

20. The method of claim 19, further comprising pumping the liquid refrigerant through the liquid loop cooling line between heat exchanger and condenser when operated in a passive cooling mode.

* * * * *